United States Patent
Ring et al.

(10) Patent No.: US 6,303,396 B1
(45) Date of Patent: Oct. 16, 2001

(54) SUBSTRATE REMOVAL AS A FUNCTION OF RESISTANCE AT THE BACK SIDE OF A SEMICONDUCTOR DEVICE

(75) Inventors: Rosalinda M. Ring; Rama R. Goruganthu; Brennan V. Davis; Jeffrey D. Birdsley; Michael R. Bruce, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/408,881

(22) Filed: Sep. 29, 1999

(51) Int. Cl.[7] .................................................. H01L 21/66
(52) U.S. Cl. ............................ 438/14; 438/13; 438/734; 250/559.27
(58) Field of Search ............................ 438/14, 13, 734; 250/559.27, 559.4, 559.22; 219/121.4

(56) References Cited

U.S. PATENT DOCUMENTS

| | | | |
|---|---|---|---|
| 4,995,939 | * | 2/1991 | Ferenczi et al. ........................ 156/627 |
| 5,430,305 | * | 7/1995 | Cole, Jr. et al. ................. 250/559.07 |
| 5,504,434 | * | 4/1996 | Schepis et al. ....................... 324/719 |
| 5,667,629 | * | 9/1997 | Pan et al. ............................... 438/13 |
| 6,015,754 | * | 1/2000 | Mase et al. ........................... 438/692 |
| 6,069,366 | * | 5/2000 | Goruganthu et al. ........... 250/559.27 |
| 6,094,982 | * | 8/2000 | Suzuki .............................. 73/204.25 |

OTHER PUBLICATIONS

D. K. Schroeder, "Semiconductor Material and Device Characterization," Second Edition, Section 1.5, pp. 35–39.

* cited by examiner

*Primary Examiner*—John F. Niebling
*Assistant Examiner*—Olivia T Luk

(57) ABSTRACT

A resistance monitoring approach is used for removing substrate from a back side of a semiconductor device. According to an example embodiment of the present invention, substrate is removed from a semiconductor device having a circuit side opposite the back side and a resistance path in silicon substrate. The change in resistance of the resistance path is monitored. The change in resistance provides an indication of the progress of the substrate removal process. Using the change in resistance, the substrate removal process is controlled.

20 Claims, 6 Drawing Sheets

SUBSTRATE REMOVAL AS A FUNCTION OF RESISTANCE AT THE BACK SIDE OF A SEMICONDUCTOR DEVICE

FIELD OF THE INVENTION

The present invention relates generally to semiconductor devices and their fabrication and, more particularly, to semiconductor devices and their manufacture involving substrate removal.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer containing the transistors, and the other active circuitry is often referred to as the circuit side of the die or front side of the die. The circuit side of the die is positioned very near the package. The circuit side opposes the back side of the die. Between the back side and the circuit side of the die is single crystalline silicon.

The positioning of the circuit side near the package provides many advantages. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

In order to access desired circuitry within the device, it is helpful to view the circuitry to determine its location. Viewing the circuitry within the chip via the back side using optical or scanning electron microscopy is typically blocked by the bulk silicon. Infrared (IR) microscopy, however, is capable of imaging the circuit through the silicon because the silicon is relatively transparent in these wavelengths of the radiation. To acquire these images, because of the absorption losses of IR radiation in silicon, it is generally required to thin the die to less than 100 microns. For example, on a die that is 725 microns thick, at least 625 microns of silicon is typically removed before IR microscopy can be used. Thinning the die for failure analysis via the back side is usually accomplished by first thinning the die across the whole die surface, often referred to as global thinning. Mechanical polishing, such as chemical-mechanical polishing (CMP), is one method for global thinning.

Once an area is identified using IR microscopy as an area of interest and it is determined that access is needed to a particular area of the circuit, local thinning techniques are often used to thin an area smaller than the die size. One method of local thinning, referred to as laser microchemical etching, is typically accomplished by focussing a laser beam on the back side of the silicon surface to cause local melting of silicon in the presence of chlorine gas. The molten silicon reacts very rapidly with chlorine and forms silicon tetrachloride gas, which leaves the molten (reaction) zone. This is a silicon removal process used in connection with the 9850 SiliconEtcher™ tool by Revise, Inc. (Burlington, Mass.). This laser process is suitable for both local and global thinning by scanning the laser over a part or whole surface of the die.

Sometimes it is helpful for failure analysis, or for design debug, to make electrical contact and probe certain nodes in the circuit that is on the circuit side or front side of the die, or to reconfigure the conductors in an integrated circuit. This access is generally done by milling through the die to access the node, or milling to the node and subsequently depositing a metal to electrically access the node. These access holes need to have high aspect ratios. Milling through silicon with fairly high aspect ratio trenches is slow and almost impractical for silicon thickness greater than 10 microns.

For these and other reasons, a method and apparatus for controlled thinning of the back side of IC devices to less than 10 micron thickness would be beneficial for the analysis of such devices. In particular, it is important to have the ability to determine the endpoint of the removal process with sufficient accuracy to avoid milling off the node to which access is being sought, which could often jeopardize further device analysis. In addition to knowing when to stop the removal process, it is also important to know how far the removal process has proceeded in order to more efficiently and more accurately control the removal process.

SUMMARY OF THE INVENTION

The present invention is exemplified in a number of implementations and applications, some of which are summarized below. According to an example embodiment, the present invention is directed to a method for removing substrate from a semiconductor device having a circuit side opposite a back side including silicon substrate. A portion of substrate in the back side of the semiconductor device is removed as a function of a detected change in resistance of a resistance path in the back side. The change in resistance provides an indication of the thickness of remaining substrate in the back side. In this manner, back side substrate removal can be accomplished in a more accurate and efficient manner.

According to another example embodiment of the present invention, a system is arranged to remove substrate from the back side of a semiconductor device having a circuit side opposite a back side having silicon substrate. A controller is arranged to control a substrate etching tool that is adapted to remove substrate from the back side of the semiconductor device. The change in resistance of a resistance path in the back side is monitored via a measurement device. A computer arrangement is coupled to the measurement device and to the controller and interprets the monitored resistance and sends a signal to the controller responsive to the interpreted resistance.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
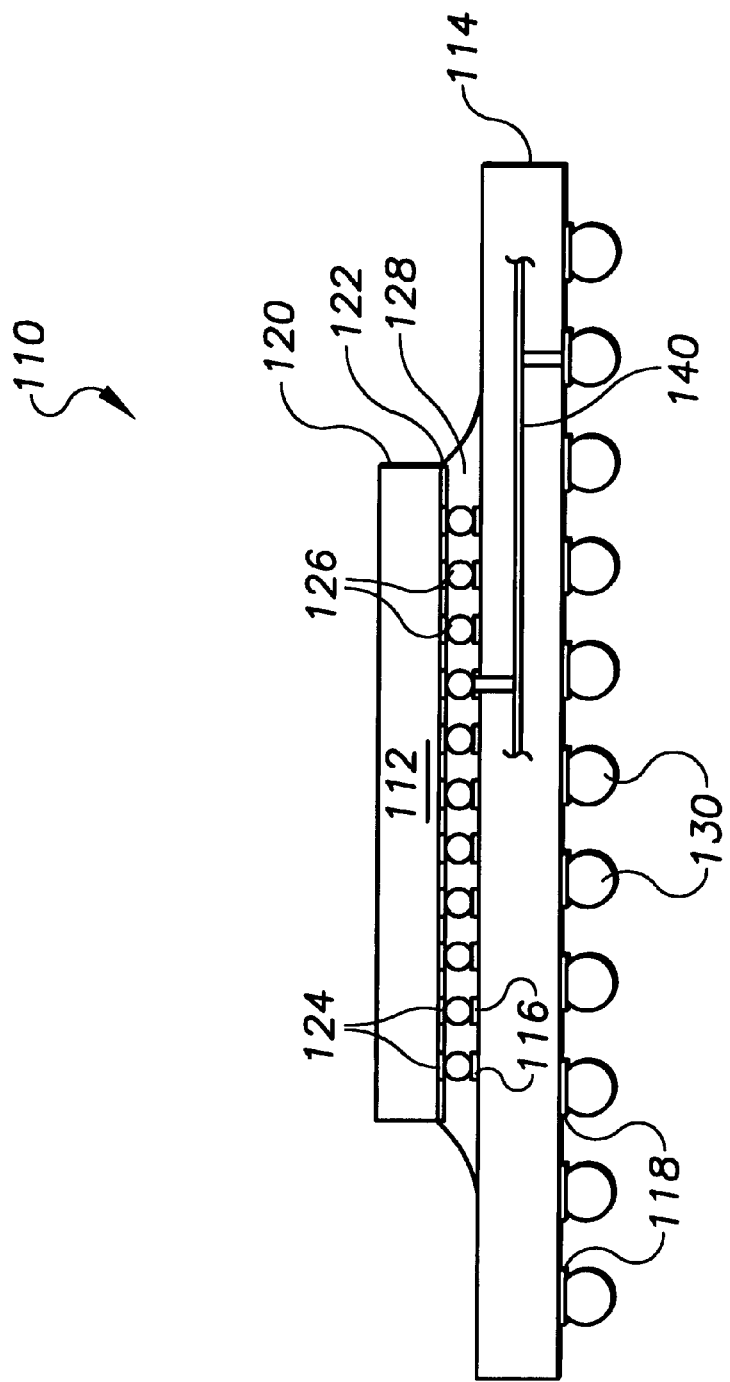
FIG. 1 shows an example side view of a flip chip packaged integrated circuit, consistent with an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices requiring or benefiting from back side milling and exposure of device circuitry. The invention has been found to be particularly suited for post-manufacturing failure analysis of target circuitry buried within relatively thick silicon in semiconductor devices. While the present invention is not necessarily limited to such devices, various aspects of the invention may be appreciated through a discussion of various examples using this context.

In an example implementation, as substrate is removed from a back side of a semiconductor device having circuitry in a circuit side opposite the back side, the resistance across a resistance path in the back side of the semiconductor device increases. The value of the increased resistance provides an indication of the amount of substrate remaining in the back side. However, using the value of the resistance to determine the thickness of the remaining substrate in the back side has limited application because leakage that can occur via $V_{dd}$/ground connections affects the resistance. Due to this leakage, it is generally necessary to use multiple calibration curves for multiple leakage levels in order to use the value of the resistance as an indication of the amount of substrate remaining in the back side.

According to an example embodiment of the present invention, it has been discovered that the amount of change in the value of resistance across substrate in the device as the back side is removed is not necessarily affected by leakage. By monitoring the change in resistance, an indication of the amount of substrate that has been removed from the back side can be determined independently from leakage that may occur. The indication can be used for controlling the substrate removal process, or for determining or estimating the thickness of the remaining substrate directly. Using this new method of monitoring the change in resistance, as compared to using the resistance value itself, is particularly advantageous because multiple calibration curves are not required for the multiple leakage levels exhibited by semiconductor devices. In this manner, substrate can be removed from the back side of a semiconductor device efficiently and accurately.

For example, substrate removal from a typical integrated circuit having a bulk silicon layer, an epitaxial silicon layer, a well layer, and a junction layer can be controlled by monitoring the change in resistance as each layer is removed. The change in resistance provides an indication of the progression of the substrate removal process. For instance, the change in resistance can be monitored and used to control the substrate removal process as substrate is removed within each layer. In addition, a change in resistance occurs when the substrate removal process has removed the bulk silicon layer, reaches the interface between the two layers, and begins to remove the epitaxial layer. This change in resistance can be detected and used as an indication that the bulk silicon layer has been removed. As more layers are removed, the corresponding change in resistance can be detected in a similar manner and used as an indication of the progression of the removal process.

The resistance measurement across a resistance path in substrate in a semiconductor device can be made in various manners. In one example embodiment, the resistance is measured via contact to terminals across the resistance path in the device. In another example embodiment, non-contacting methods for measuring the resistance across the device are used. Typical non-contacting resistance measurement technique include microwave, capacitive, and inductive coupling for measuring resistance between two locations. Such non-contacting resistance measurement methods are discussed in "Semiconductor Material and Device Characterization," $2^{nd}$ Ed., Section 1.5, beginning on page 35 by DK Schroeder, incorporated herein by reference. For example, in one contact-less measurement approach, the resistance measurement equipment is capacitively coupled to one or both measuring locations. In another example embodiment, and relating to the inductive contact-less approach, the measurement device is used for creating an eddy current in the device, which can be detected and used to make the resistance measurement.

Another example implementation of the present invention involves arranging the semiconductor device in a test fixture. The test fixture is adapted to measure the change in resistance in a resistance path between the back side of the semiconductor device and a reference node as substrate is removed from the back side. The measured change in resistance can then be used to control the substrate removal.

A particular application of the present invention includes the analysis of flip-chip type semiconductor devices. FIG. 1 shows a side view 110 of a type of conventional flip-chip type die 112 assembled to a package substrate 114, for use in connection with an example embodiment of the present invention. Flip chip die 112 has a back side 120 and a circuit side in a portion of the die known as the epitaxial layer 122. The epitaxial layer 122 includes a number of circuit devices and has a thickness in the range of about one to fifteen microns. Bulk silicon fills the back side 120 and is referred to as the bulk silicon layer. A plurality of solder bumps 126 are made on the circuit side at pads 124. The solder bumps 126 are the inputs and outputs to the circuitry associated with the flip chip type die 112. The flip chip type die 112 is attached to the package substrate 114 via the solder bumps on the die 112. The package substrate 114 includes pads 116 that are arranged to correspond to the pattern of solder bumps 126 on the die 112. The region between the die 112 and package substrate 114 is filled with an under-fill material 128 that encapsulates the solder bump connections and provides additional mechanical benefits. The pads 116 are coupled via circuitry to pads 118 on the package substrate, and solder bumps 130 are formed on the pads 118. The solder bumps 130 are the inputs and outputs to the circuitry 140 associated with the package substrate 114.

Figure 2:
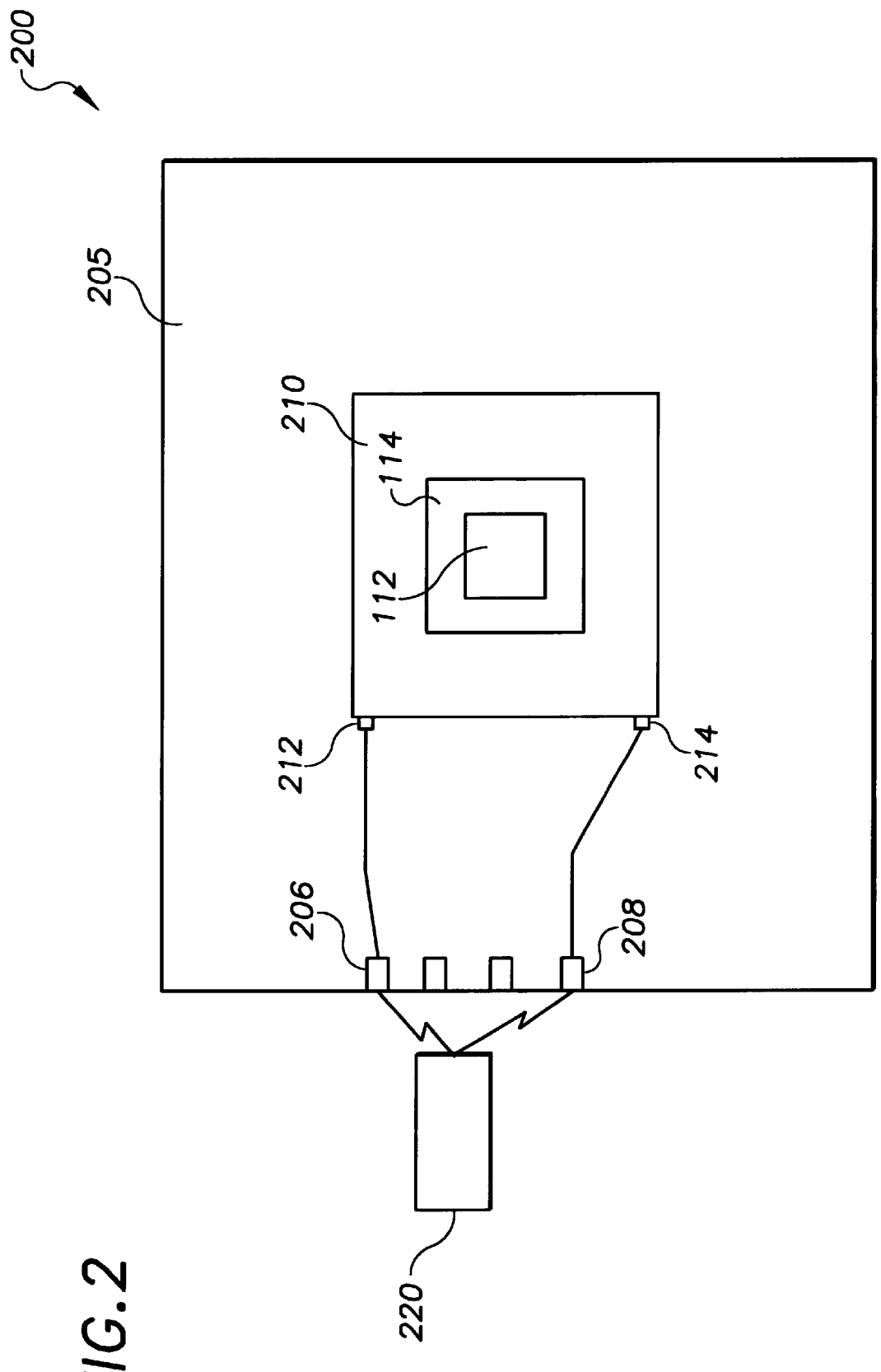
FIG. 2 shows a top view of the flip chip packaged integrated circuit of FIG. 1 coupled to a daughter card and a carrier, according to an example embodiment of the present invention.

FIG. 2 is a top view of the flip-chip die 112 and package 114 of FIG. 1 coupled to a daughter card 210 and a carrier 205, according to an example embodiment of the present invention. Terminals 212 and 214 in the daughter card 210 are coupled across substrate in the die 112 via circuitry in the daughter card 210 and the package 114. Terminals 212 and 214 are further coupled to terminals 206 and 208 in the carrier 205. A resistance measurement device 220 is coupled across terminals 206 and 208 and used to measure the change in resistance across substrate in the die 112.

Figure 3:
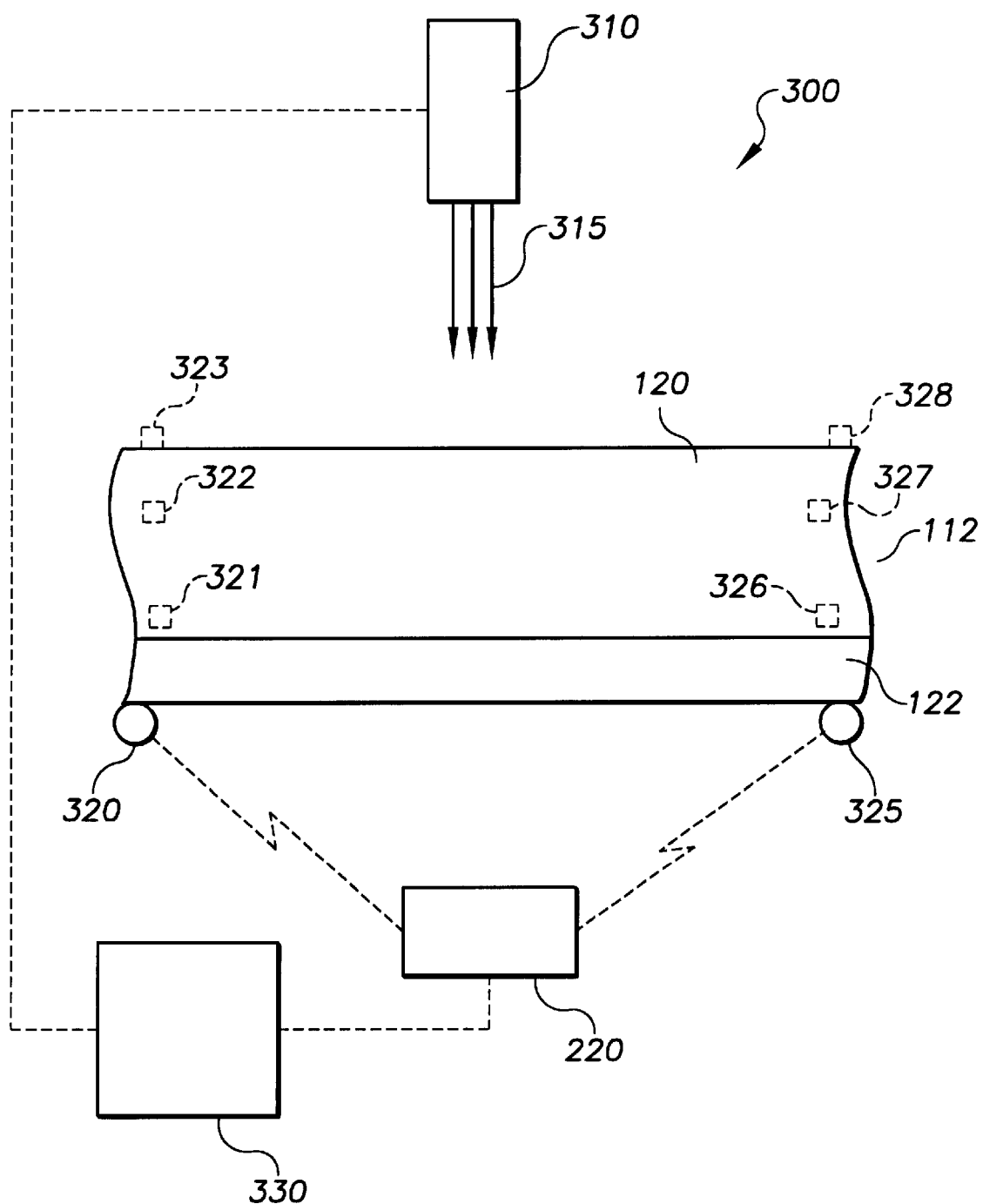
FIG. 3 shows a side view of an integrated circuit undergoing substrate removal, according to another example embodiment of the present invention.

FIG. 3 shows a side view of a system 300 for substrate removal, according to another example embodiment of the present invention. Ion bombardment device 310 is used to direct an ion beam 315 at the back side 120 of the flip-chip die 112, shown also in FIGS. 1 and 2. In alternative example embodiments, a laser etching device or a chemical-mechanical polishing device can be used in place of the ion bombardment device. Some or all of the substrate is removed from the back side 120, and a resistance measurement is made.

Various terminal locations can be used for making the measurement. In one example embodiment of the present invention, terminals 320 and 325 are connected to the substrate 120 on either side of the die. Resistance measurement device 220 is coupled to terminals 320 and 325 via circuitry as described in connection with FIG. 2 and used to measure the change in resistance across the substrate in the die 112 as substrate is removed. Resistance measurement device 220 may, for example, include an ohmmeter, an HP4156 device, or a curve tracer. In another example embodiment, the resistance measurement is made by connecting device 220 horizontally across terminals 321 and 326 near the intersection of the circuit side and the back side 112. Similarly, the horizontal resistance measurement can be made across terminals 322 and 327, or across terminals 323 and 328. In addition, the resistance measurement can be made vertically, such as between terminals 321 and 323.

The change in resistance can be used to control the substrate removal process in various manners. For example, the change in resistance can be used to determine the remaining thickness in the back side of the die. Using the thickness determination, the substrate removal process can be controlled. In another example embodiment of the present invention, the change in resistance is used to control the substrate removal process without necessarily determining the thickness. For example, a standard change in resistance can be determined for substrate removal from a reference die. By comparing the change in resistance of a device under test with the standard, the progress of the substrate removal can be determined without necessarily determining the thickness of remaining substrate in the device under test.

Figure 4:
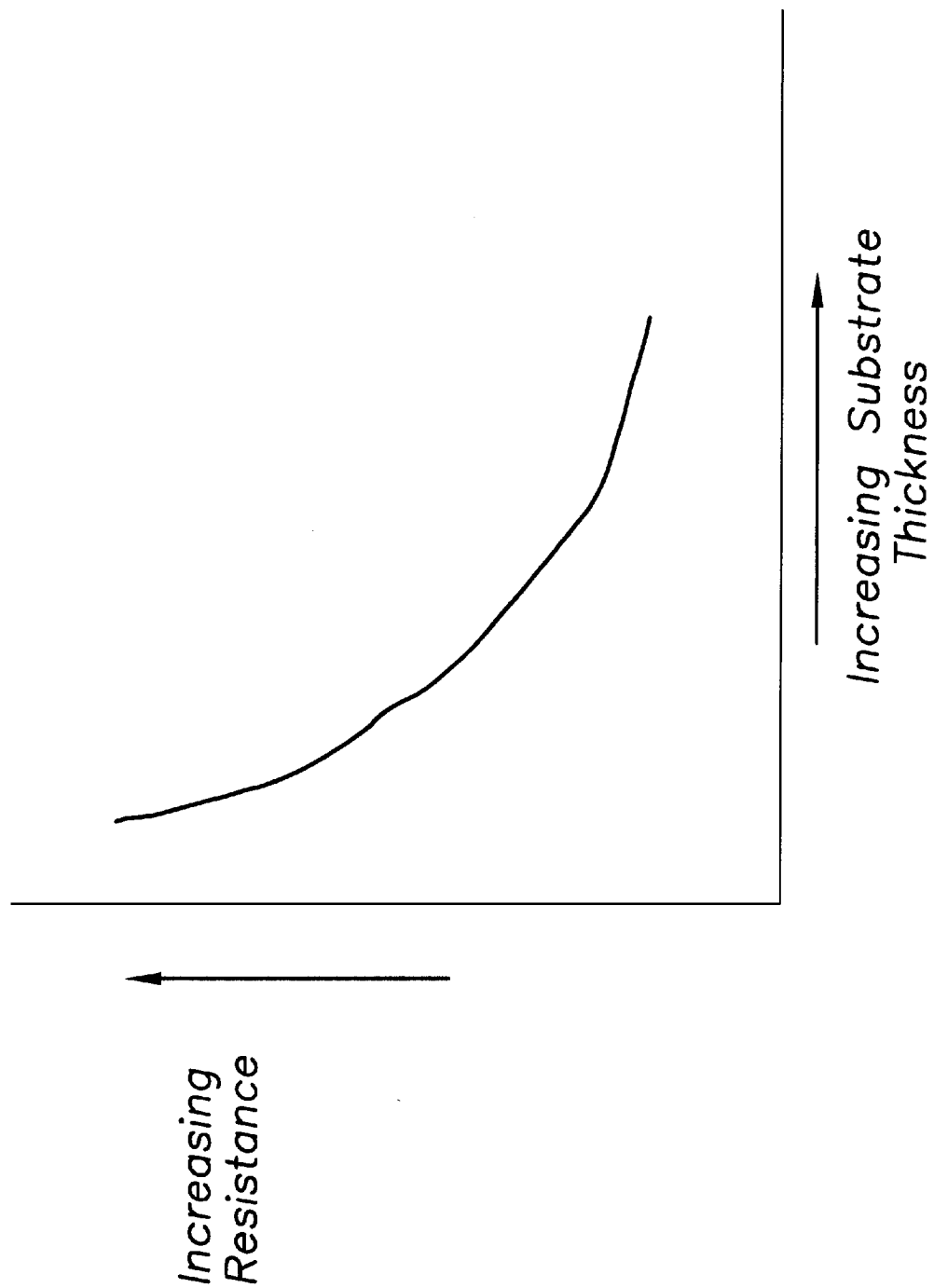
FIG. 4 is a graph showing an example relationship of resistance and substrate thickness.
Figure 5:
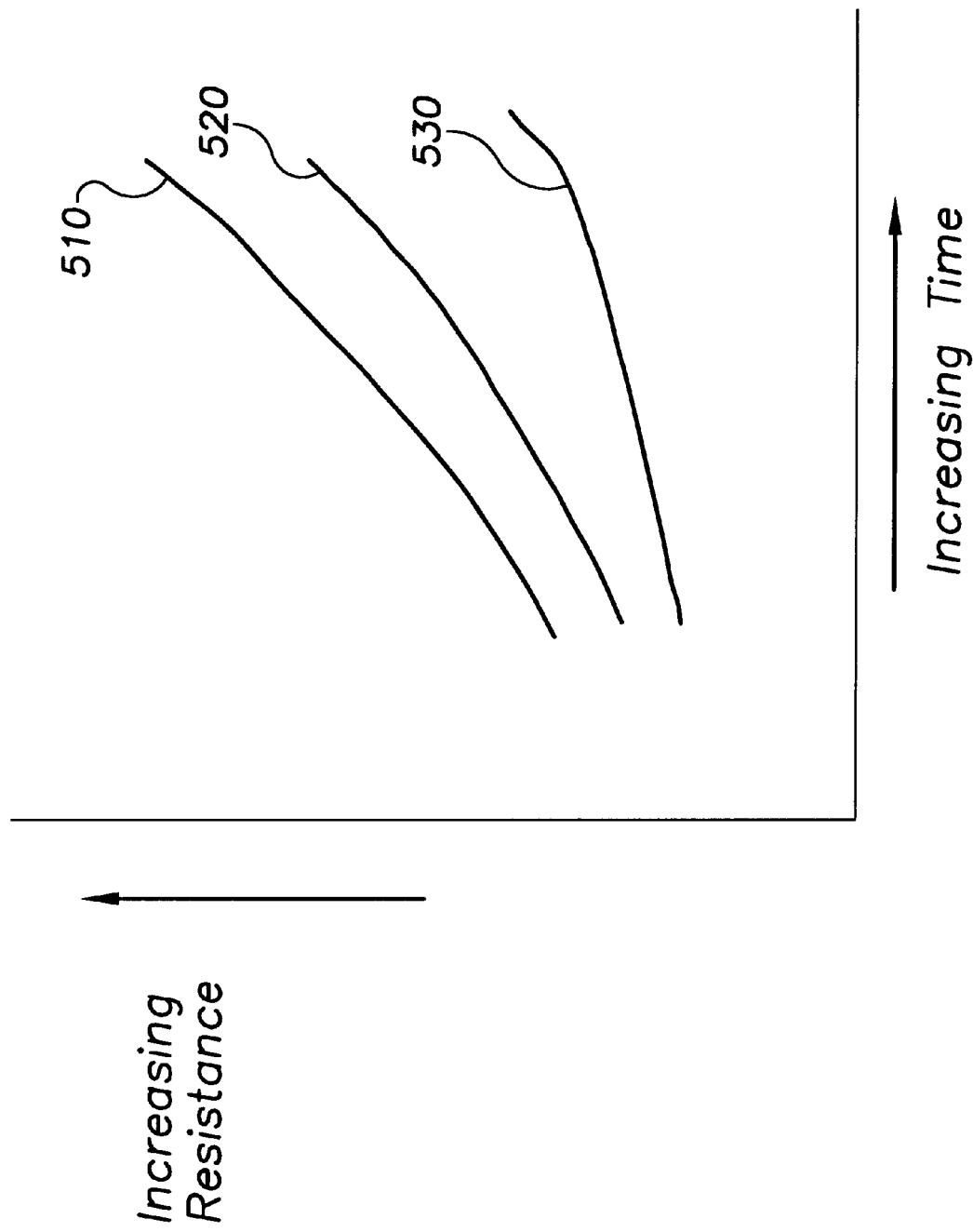
FIG. 5 is a graph showing example changes in resistance during substrate removal, in connection with an example embodiment of the present invention.

FIG. 4 shows an example relationship of substrate thickness and resistance in a typical integrated circuit die. As substrate in the die is removed, the resistance across the substrate increases. FIG. 5 shows example curves 510, 520, and 530 showing example changes in the rate of change of resistance over time. Each of the curves may represent the resistance versus time for a particular example material having characteristics including a rate of change in resistance as shown. By using resistance measurement device 220, shown in FIGS. 2 and 3, and detecting the change in the rate of change of resistance as shown by example in FIG. 5, the substrate removal process is controlled.

For example, and according to another example embodiment of the present invention, substrate is removed from the back side of an integrated circuit having at least three layers, wherein each layer has resistive properties that vary as the substrate is removed as shown in curves 510, 520, and 530. The layers may, for example, include material such as bulk silicon (p++), epitaxial silicon (p+), p-well silicon (p−), n-active silicon (n+), n-well silicon (n−), and p-active silicon (p+). For this illustrative embodiment, the first layer has properties corresponding to curve 510, the second layer has properties corresponding to curve 520, and the third layer has properties corresponding to curve 530. Those skilled in the art will recognize that several other curves may fit particular layers that can be arranged in various sequences. When the first layer is being removed the rate of increase of resistance matches curve 510. When the first layer has been removed and the substrate removal process continues with the second layer, the rate of change in resistance is altered, such as shown in curve 520. Similarly, when the second layer has been removed and the substrate removal process continues with the third layer, the rate of change is altered, such as shown in curve 530. Using curves such as shown in FIG. 5, the substrate removal process can be controlled.

Figure 6:
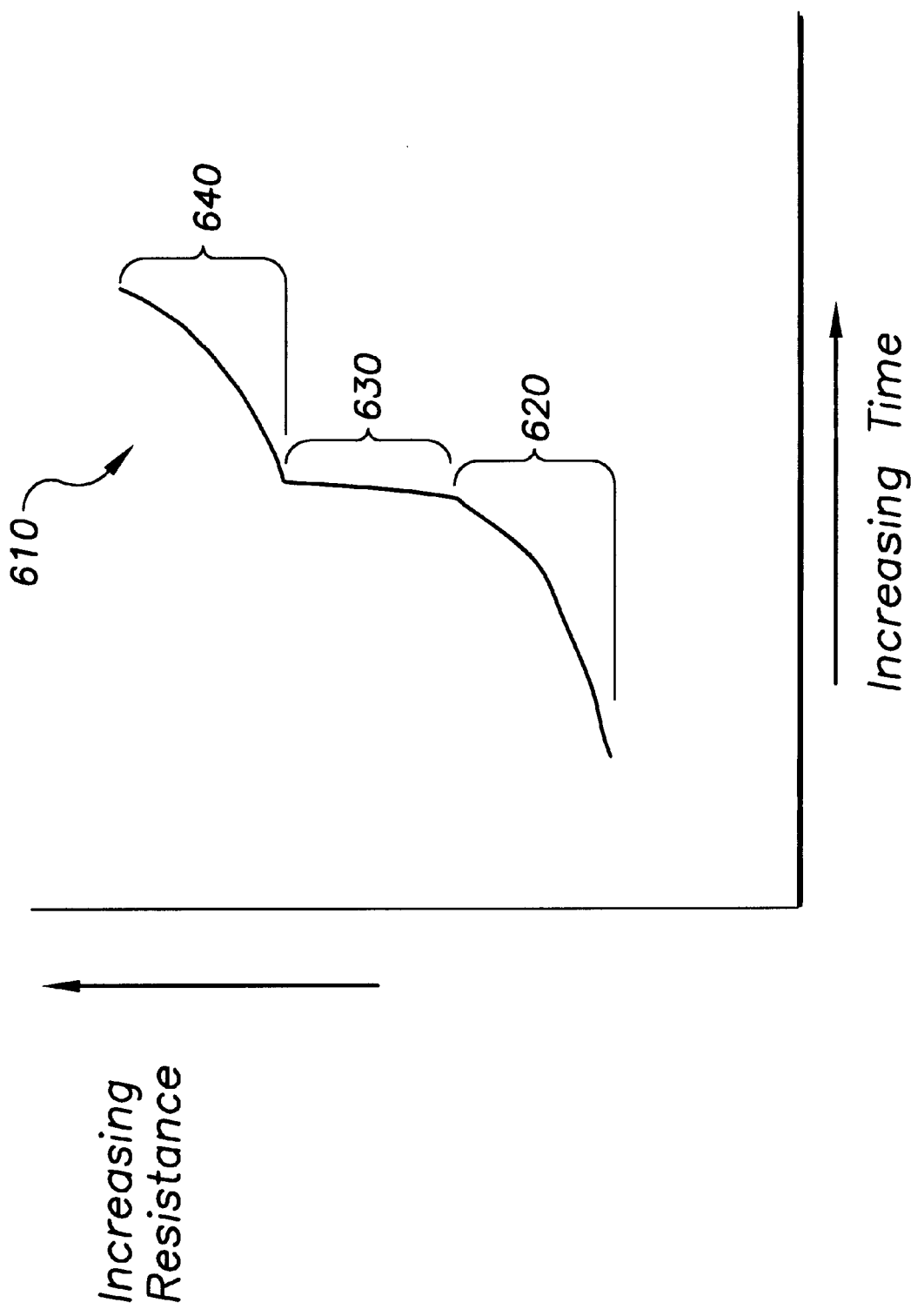
FIG. 6 is a graph showing another example resistance plot during substrate removal, in connection with another example embodiment of the present invention.

According to another example embodiment of the present invention, another method for detecting the transition from removing a first type of substrate to removing a second type of substrate involves detecting a step in resistance over time. For example, FIG. 6 is a graph of resistance over time as shown by curve 610 for a semiconductor device undergoing substrate removal. As the substrate removal process removes all of one layer, such as a bulk silicon layer, and begins to remove a second layer, such as an epitaxial silicon layer, the resistance steps. For instance, the portion 620 of curve 610 represents the change in resistance versus time as a first layer is removed. When the first layer is removed, the resistance steps up, shown as portion 630 of curve 610. As the second layer is removed, the change in resistance versus time is shown as portion 640 of curve 610. By detecting the step in resistance, the progress of the substrate removal process can be determined.

According to another example embodiment of the present invention, and referring again to FIGS. 2 and 3, resistance measurement device 220 is optionally coupled to a computer arrangement 330. The computer arrangement 330 is used and the change in resistance across terminals 320 and 330 is monitored and used for controlling the substrate removal process. For example, the computer arrangement 330 can be used to plot the change in resistance which can be monitored and used to control the substrate removal process. The computer can be arranged to signal when the change in resistance reaches a threshold level of particular interest for use in the removal process, such as to indicate approaching or reaching a process endpoint. In another example embodiment of the present invention, a single circuit includes the measurement device 220, the ion bombardment device 310, and the computer arrangement 330.

One or more threshold levels may be determined by estimating the amount of substrate remaining in the device, or by conducting empirical tests on semiconductor devices while undergoing substrate removal to develop a relationship between the resistance and the substrate removal process. Empirical tests may be used, for instance, to develop a set of curves for particular types of substrate. The results can be placed into graphical form for inspection, such as shown in FIG. 5, or used by the controller without generating a graph. Empirical tests may also be used to determine the magnitude of the change in resistance as interfaces between layers of substrate in a semiconductor device are encountered by the substrate removal process. The relationship developed between the resistance and the substrate removal process can be used in subsequent substrate removal processes to control the removal process or to estimate the thickness of the remaining substrate.

In another example embodiment of the present invention, computer arrangement 330 is further coupled to the ion bombardment device 310 and configured and arranged to control the substrate removal process. For instance, when the change in resistance reaches a threshold level, the computer arrangement 330 can send a control signal to the ion bombardment device 310 in response to reaching the threshold level. The threshold level may correspond to reaching a portion of the die 112 where it is desired to slow the removal process. The computer arrangement then sends a signal to slow the process, such as by reducing the power level of the ion bombardment device 310. The threshold level may also correspond to reaching an endpoint of the removal process, wherein the computer arrangement sends a control signal to stop the substrate removal via the ion bombardment device. In this manner, the substrate removal process can be automatically controlled in response to the change in resistance across substrate in the die 112.

While the present invention has been described with reference to several particular example embodiments, those skilled in the art will recognize that many changes may be made thereto without departing from the spirit and scope of the present invention, which is set forth in the following claims.

What is claimed is:

1. A method for removing silicon substrate from a back side of a semiconductor device having a circuit side opposite the back side and a resistance path in the silicon substrate, the resistance path being susceptible to leakage, the method comprising:
    monitoring the change in resistance of the resistance path in the silicon substrate; and
    responsive to the monitored change in resistance, removing a portion of the silicon substrate in the back side of the semiconductor device.

2. The method of claim 1, wherein monitoring the change in resistance of the resistance path in the silicon substrate includes monitoring changes in resistance provided using a contact-less means for measuring resistivity.

3. The method of claim 1, further comprising determining the thickness of remaining substrate in the back side as a function of the monitored change in resistance.

4. The method of claim 1, wherein removing a portion of substrate in the back side includes programming a computer arrangement to monitor changes in resistance and to provide a control for the substrate removal.

5. The method of claim 1, wherein removing a portion of substrate in the back side of the semiconductor device comprises:
    removing substrate at a first removal rate until a point at which the monitored change in resistance reaches a first threshold level defined as a function of the semiconductor device under test and the step of monitoring;
    reducing the removal rate to a second removal rate, responsive to reaching the first threshold level;
    removing substrate at the second removal rate until the monitored change in resistance reaches a second threshold level defined as a function of the semiconductor device under test and the step of monitoring; and
    responsive to reaching the second threshold level, stopping the removal process.

6. The method of claim 5, further comprising using a computer arrangement programmed to respond to the monitored resistance, reduce the removal rate, and stop the removal process.

7. The method of claim 1, wherein removing a portion of substrate in the back side of the semiconductor device includes estimating the amount of substrate remaining based on the change in resistance.

8. The method of claim 7, wherein estimating the amount of substrate remaining includes conducting empirical tests to determine a standard relationship of changes in resistance to substrate remaining in the back side.

9. The method of claim 1, wherein monitoring the change in resistance includes measuring across substrate having silicon regions including at least one of: bulk silicon (p++), epitaxial silicon (p+), p-well silicon (p−), n-active silicon (n+), n-well silicon (n−), and p-active silicon (p+).

10. The method of claim 1, wherein the back side includes at least two layers and an interface between the two layers, and wherein monitoring the change in resistance includes monitoring the change in resistance when the substrate removal process reaches the interface.

11. The method of claim 1, wherein monitoring the change in resistance includes monitoring the rate of change of the resistance.

12. The method of claim 11, wherein the rate of change of the resistance is determined for a particular type of substrate, and wherein monitoring the rate of change of the resistance includes identifying the type of substrate that is being removed.

13. The method of claim 12, wherein removing a portion of substrate in the back side of the semiconductor device comprises using a graphical representation of the resistance over time.

14. The method of claim 1, wherein the semiconductor device includes a flip-chip type die mounted conventionally on a daughter card, and wherein monitoring the change in resistance of the resistance path in the silicon substrate includes electrically coupling to the die via the daughter card.

15. A method for removing substrate from a semiconductor device, wherein the device has a circuit side opposite a back side and silicon substrate, the method comprising the steps of:

(A) monitoring the resistance of a resistance path in the silicon substrate;

(B) removing substrate from the back side of the semiconductor device until an endpoint determined as a function of a change in the resistance is detected and in response thereto, adjusting the substrate removal rate;

(C) repeating step B until a final endpoint is detected; and (D) responsive to detecting the final endpoint, terminating the removal process.

16. A system for removing silicon substrate from a back side of a semiconductor device, the device having a circuit side opposite the back side and a resistance path in the silicon substrate, the resistance path being susceptible to leakage, the system comprising:

means for monitoring a change in resistance of the resistance path in the silicon substrate; and means for removing a portion of the silicon substrate from the back side of the semiconductor device in response to a change in resistance monitored by the means for monitoring.

17. The system of claim 16, wherein the means for removing substrate includes at least one of: a ion-bombardment device, a laser etching device, and chemical-mechanical polishing.

18. The system of claim 16, wherein the means for monitoring resistance includes at least one of: an ohmmeter, an HP4155 device and a curve tracer.

19. A system for removing silicon substrate from a back side of a semiconductor device, the device having a circuit side opposite the back side and a resistance path in the silicon substrate, the resistance path being susceptible to leakage, the system comprising:

a resistance monitoring device adapted to monitor a change in resistance of the resistance path in the silicon substrate;

a substrate removal device adapted to remove a portion of the silicon substrate from the back side of the semiconductor device in response to a change in resistance monitored by the monitoring device; and a computer arrangement coupled to the resistance monitoring device and configured and arranged to interpret the monitored change in resistance and to send a signal to the substrate removal device responsive to the interpreted change in resistance.

20. A system for removing substrate from a semiconductor device, according to claim 19, further including a circuit comprising the resistance monitoring device, the substrate removal device, and the computer arrangement.

* * * * *